US009195229B2

(12) United States Patent
Stokes et al.

(10) Patent No.: US 9,195,229 B2
(45) Date of Patent: Nov. 24, 2015

(54) TESTING A CONTROL SYSTEM INCLUDING A VALVE

(75) Inventors: Martin Stokes, Newport Gwent (GB); Julian Richard Davis, Frampton Cotterell (GB)

(73) Assignee: GE OIL & GAS UK LIMITED, Nailsea (GB)

( * ) Notice: Subject to any disclaimer, the term of this patent is extended or adjusted under 35 U.S.C. 154(b) by 305 days.

(21) Appl. No.: 13/277,616

(22) Filed: Oct. 20, 2011

(65) Prior Publication Data

US 2012/0098546 A1     Apr. 26, 2012

(30) Foreign Application Priority Data

Oct. 26, 2010 (EP) .................................. 10188926

(51) Int. Cl.
| | |
|---|---|
| *G01R 31/14* | (2006.01) |
| *G05B 23/02* | (2006.01) |
| *F16K 37/00* | (2006.01) |
| *G01R 31/02* | (2006.01) |
| *G01R 19/145* | (2006.01) |

(52) U.S. Cl.
CPC ........ *G05B 23/0256* (2013.01); *F16K 37/0083* (2013.01); *G01R 19/145* (2013.01); *G01R 31/02* (2013.01); *G01R 31/025* (2013.01)

(58) Field of Classification Search
CPC .. G01R 31/025; G01R 31/02; G01R 31/2829; G01R 31/14; G01R 31/06; G01R 19/145; G01R 27/2605; G01R 27/02; G01V 3/04; G01V 3/02; G01V 3/06; G01V 3/104; G01V 13/00; G08C 19/30; G08C 25/02

USPC ........ 324/511; 340/850, 853.3, 855.8; 702/34
See application file for complete search history.

(56) References Cited

U.S. PATENT DOCUMENTS

| | | | | |
|---|---|---|---|---|
| 4,309,734 | A | * | 1/1982 | Warren ............................ 361/58 |
| 4,742,792 | A | * | 5/1988 | Mank et al. .................... 114/264 |
| 5,153,522 | A | * | 10/1992 | Sano .............................. 324/546 |
| 5,241,218 | A | * | 8/1993 | Page .............................. 307/104 |
| 5,365,769 | A | | 11/1994 | Ferry |
| 5,621,603 | A | * | 4/1997 | Adamec et al. ............... 361/154 |
| 5,784,245 | A | * | 7/1998 | Moraghan et al. ............ 361/154 |
| 5,889,405 | A | * | 3/1999 | Yanai et al. ................... 324/522 |
| 6,208,497 | B1 | * | 3/2001 | Seale et al. .................... 361/160 |
| 6,211,665 | B1 | * | 4/2001 | Ahrendt et al. .......... 324/207.16 |

(Continued)

FOREIGN PATENT DOCUMENTS

| | | |
|---|---|---|
| CN | 1169538 A | 1/1998 |
| CN | 1238824 A | 12/1999 |

(Continued)

OTHER PUBLICATIONS

EP Search Report issue on Apr. 4, 2011 in connection with EP Patent Application 10188926.9 file don Oct. 26, 2010.

(Continued)

*Primary Examiner* — Patrick Assouad
*Assistant Examiner* — Sean Curtis
(74) *Attorney, Agent, or Firm* — GE Global Patent Operation

(57) ABSTRACT

A method of testing a control system including a valve which is operable by a solenoid is disclosed. The method comprises applying a current through a coil of the solenoid, the current being insufficient to cause the solenoid to operate the valve, and monitoring a response of the system to the current.

20 Claims, 5 Drawing Sheets

(56) References Cited

U.S. PATENT DOCUMENTS

| | | | |
|---|---|---|---|
| 6,213,215 B1 * | 4/2001 | Breivik et al. | 166/350 |
| 6,420,976 B1 * | 7/2002 | Baggs et al. | 340/853.3 |
| 6,942,469 B2 * | 9/2005 | Seale et al. | 417/413.1 |
| 7,609,069 B2 * | 10/2009 | Berg et al. | 324/546 |
| 7,895,001 B2 * | 2/2011 | Tanju et al. | 702/34 |
| 7,930,089 B2 * | 4/2011 | Askew | 701/104 |
| 2006/0285265 A1 * | 12/2006 | Ganev et al. | 361/160 |
| 2007/0100478 A1 | 5/2007 | Egeland et al. | |
| 2008/0217022 A1 * | 9/2008 | Deans | 166/338 |
| 2009/0108849 A1 * | 4/2009 | Berg et al. | 324/546 |
| 2010/0148755 A1 * | 6/2010 | Liu | 324/123 R |
| 2010/0161250 A1 * | 6/2010 | Tanju et al. | 702/51 |
| 2011/0158050 A1 * | 6/2011 | Merino et al. | 367/81 |
| 2012/0212230 A1 * | 8/2012 | Davis et al. | 324/418 |

FOREIGN PATENT DOCUMENTS

| | | | | |
|---|---|---|---|---|
| CN | 101441475 A | | 5/2009 | |
| EP | 2053289 A2 * | | 4/2009 | F16K 31/06 |
| WO | 0106162 A2 | | 1/2001 | |
| WO | WO 01/06162 A2 * | | 1/2001 | F16K 37/00 |
| WO | WO 0106162 A2 * | | 1/2001 | F16K 37/00 |

OTHER PUBLICATIONS

Unofficial English Translation of Chinese Office Action and Search Report issued in connection with corresponding CN Application No. 201110355982.2 on Jan. 6, 2015.

* cited by examiner

TESTING A CONTROL SYSTEM INCLUDING A VALVE

BACKGROUND OF THE INVENTION

1. Field of the Invention

The field of the invention relates to testing a control system including a valve.

2. Description of the Prior Art

Control valves of control systems for subsea fluid production wells are often operated infrequently (e.g. every 6 months or less). A problem is that there may be a fault in the system which would not be apparent until the well operator tries to operate the valve. Discovery of the failure in an emergency situation could be disastrous.

Systems according to embodiments of this invention enable the well operator to be given advance notice of a failure, thus substantially reducing the possibility of discovery of a system failure only in an emergency situation. Systems according to embodiments of the invention frequently test the communications, control circuitry, monitoring circuitry, wiring to the valve and a solenoid coil of a solenoid for operating the valve, without actually operating it. Thus, if it is known that there is a problem before the function is actually needed, reliability can be increased by scheduling such a test during scheduled maintenance.

BRIEF SUMMARY OF THE INVENTION

According to an embodiment of the present invention, a method of testing a control system including a valve which is operable by a solenoid is disclosed. The method comprises applying a current through a coil of the solenoid, the current being insufficient to cause the solenoid to operate the valve, and monitoring a response of the system to the current.

According to an alternate embodiment of the present invention a control system including a valve which is operable by a solenoid is disclosed. The system comprises a power control configured to apply a current through a coil of the solenoid, the current being insufficient to cause the solenoid to operate the valve, and a monitoring arrangement configured to monitor a response of the system to the current.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION OF THE INVENTION

Embodiments of the present invention improve the reliable operation of a subsea valve by testing the communications, control circuitry, monitoring circuitry, wiring and a solenoid coil at regular intervals, generally at a much greater frequency than the valve is used in operation. This is achieved by taking advantage of the fact that the current necessary to drive a valve operating solenoid ramps up relatively slowly. By firing the solenoid coil for only a short period of time, this current can be sensed to verify that all the necessary elements are working correctly. The power to the solenoid coil is turned off before current has ramped up enough to operate the valve.

Figure 1:
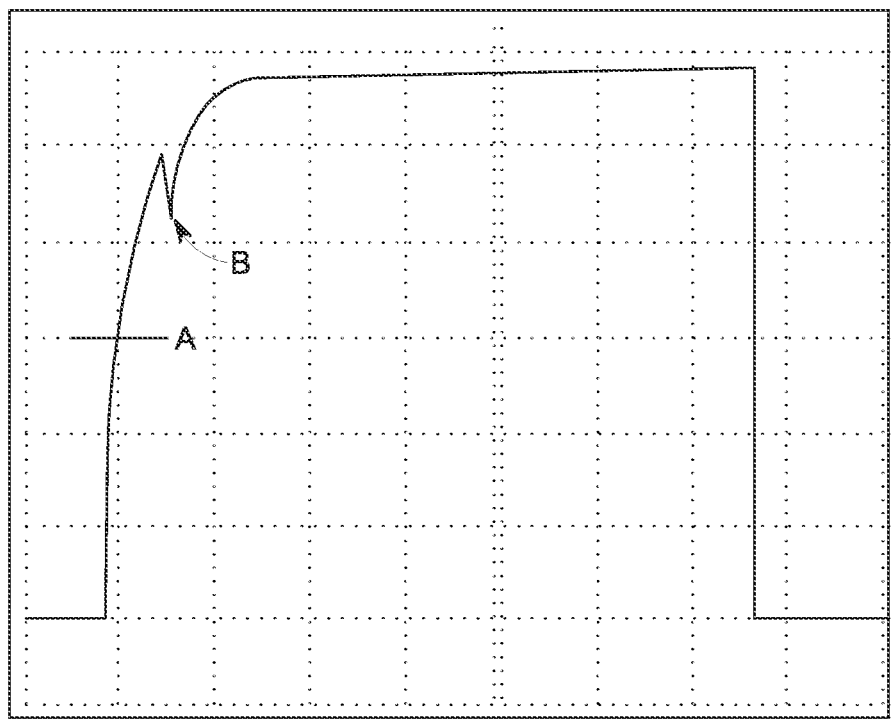
FIG. 1 is a graph of current against time fir a typical current flow through a solenoid coil of a directional control valve (DCV) within a subsea control system when the valve is operated.

FIG. 1 is a graph of current against time for a typical current flow through the solenoid coil of the solenoid of a directional control valve (DCV) at a tree within a control system for a subsea fluid extraction well when the valve is operated. As can be seen, the current rise from the application of the supply voltage to the solenoid coil is not instantaneous, due to the inductance of the solenoid coil, but ramps up to the point B on the graph, in, typically, between 50 and 300 milliseconds, when the solenoid mechanically operates. The current continues to rise until it reaches a steady state level determined by the resistance of the solenoid coil and the supply voltage, which is high enough to ensure that the solenoid is held in the 'operated' condition. In embodiments of the invention, the current in the DCV solenoid coil is allowed to rise to level A, typically after 10 to 20 milliseconds, which is insufficient to operate the solenoid but sufficient to be detected to provide confidence that at least the control communications, circuitry and wiring, including the DCV solenoid coil itself, are functioning correctly. In one embodiment, the current in the DCV solenoid coil is detected by monitoring the voltage across a small resistor connected in series with the solenoid coil.

Figure 2:
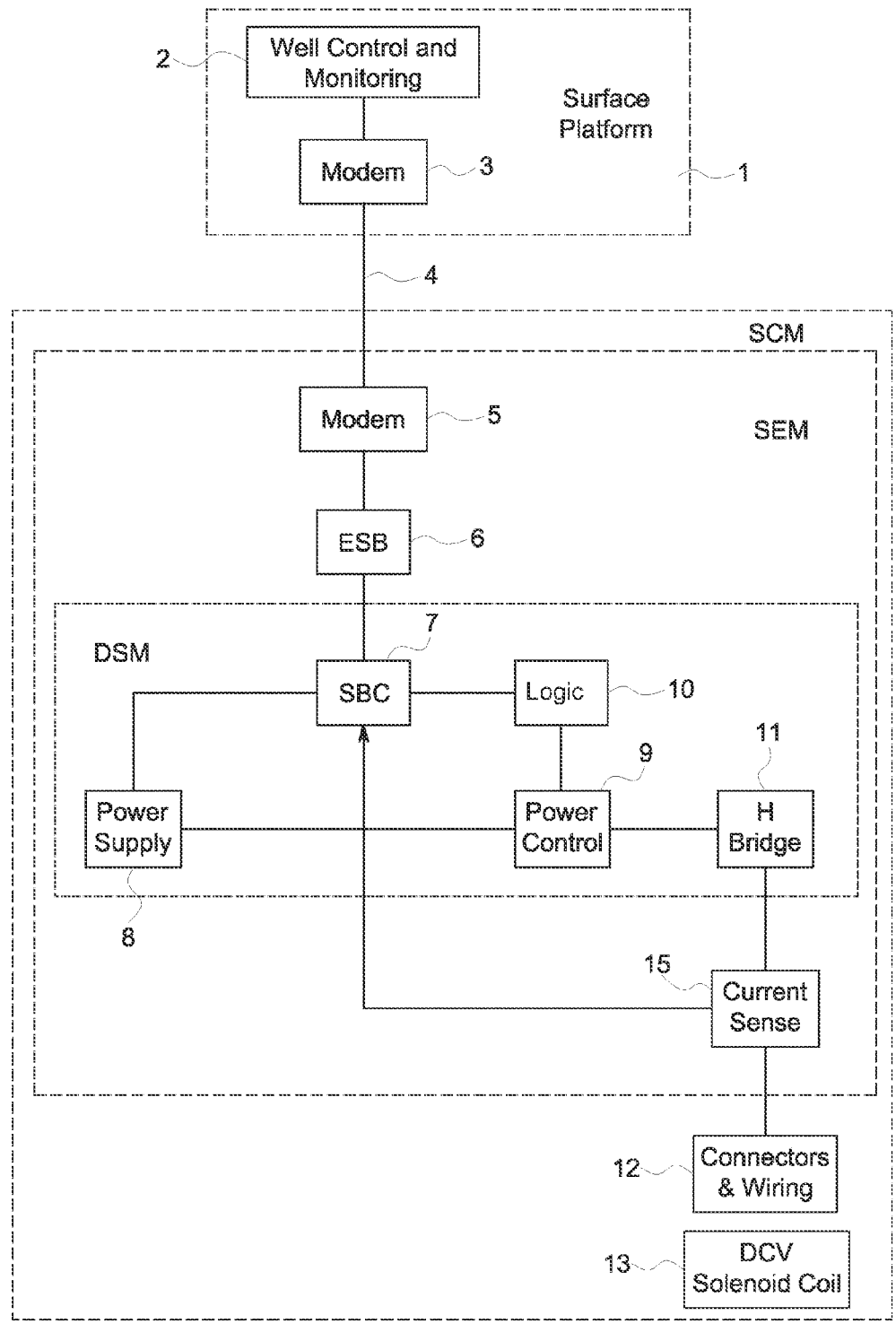
FIG. 2 is a schematic diagram of a control system for a subsea well operating in accordance with an embodiment of the invention.

Operation of the DCVs of a well control system for a subsea well is normally controlled from a surface platform via a complex communication system, a typical example of which (modified in accordance with an embodiment of the invention) is illustrated in FIG. 2. The command signal to operate a DCV, as a well operating function, is generated at a surface platform 1 by a well control and monitoring arrangement 2 and is transmitted via a modem 3 at the platform through a surface to subsea well umbilical 4 to a subsea control module (SCM), which houses a subsea electronics module (SEM), which in turn houses a subsea modem 5 and an Ethernet switch blade (ESB) 6 and a single board computer (SBC) 7. The ESB 6 and SBC 7 are features of modern subsea well communications, and handle the control signals to the multiplicity of drivers for the DCVs on the well. The SBC 7 is located in a directional control valve support module (DSM) containing a power supply 8, power control 9 and control logic 10 to output supply voltage to the solenoid coils of DCVs located in the SCM via an H bridge 11 and connectors and wiring 12. In the system diagram FIG. 2, a DCV solenoid coil 13 of only one DCV is shown for simplicity.

Figure 3:
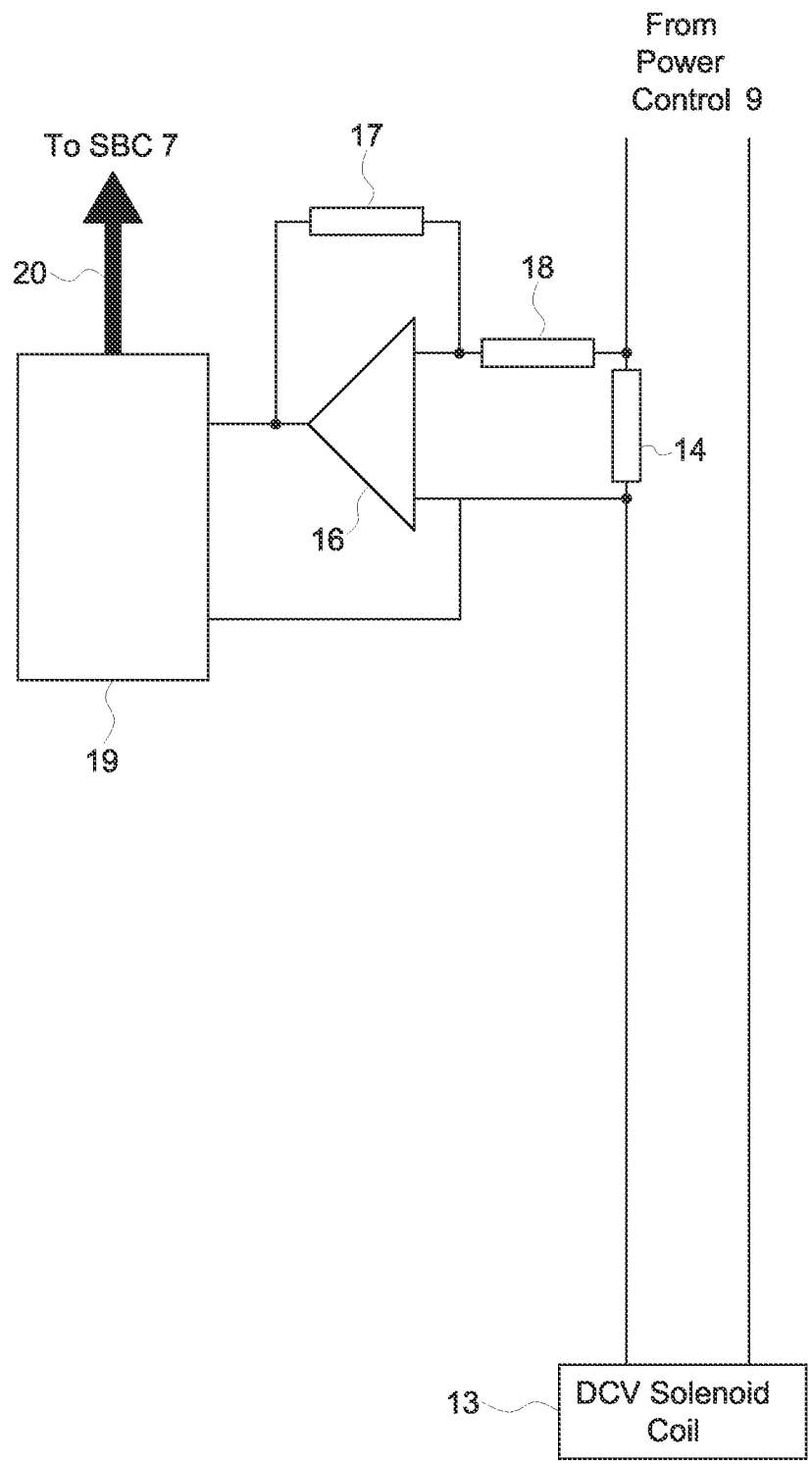
FIG. 3 shows details of current sensing means of the system of FIG. 2.

Testing of the control system routing comprising the communications, control circuitry, monitoring, wiring and solenoid coil, by a current flow sensing method is effected by the well control and monitoring arrangement 2 being programmed to command power control module 9, via the communication route described above, to output a power supply pulse to the solenoid coil 13, for a limited duration of typically 10 to 20 milliseconds. Although the route of the command signal is the same as the normal operational route, the test command message includes a 'test tag' in the message so that the SBC 7 produces only the required 10 to 20 ms current drive through the DCV solenoid coil 13 rather than the continuous DC input to the coil under operational conditions. The current passing through the solenoid coil also passes though a small value, typically 1% of the coil resistance, resistor 14, as shown in FIG. 3 which is an expansion of current sensing means 15 between bridge 11 and connectors and wiring 12. The small voltage produced across the resistor 14 due to the current flowing through the coil 13, is amplified by an operational amplifier 16, with the gain set by resistors 17 and 18, to provide a suitable voltage level to an analogue to digital converter (A/D) 19. The digital output 20 of the A/D 19 represents the current flow through the coil 13 and is fed to the SBC 7, where it can either be sent back to the surface platform via the communication system for verification, or it can be compared, in the SBC 7, with stored values of correct expected test values and a verification or otherwise message sent to the surface platform 1. Thus, confidence is provided that the complex control signal routing is functioning correctly, and that the solenoid coil drive and coil continuity is correct. Operation of the test routine can be effected by the well operator and/or automatically at regular intervals by suitable programming of the well control and monitoring arrangement 2 at the surface platform.

The current sensing means 15 could be elsewhere than as shown. For example, it could be immediately before the solenoid coil 13, after the coil 13, before the H bridge 11 or anywhere suitable in the control system.

As an alternative to monitoring current by monitoring the voltage drop across a resistor, current sensing means 15 could be provided using a Hall effect device.

Figure 4:
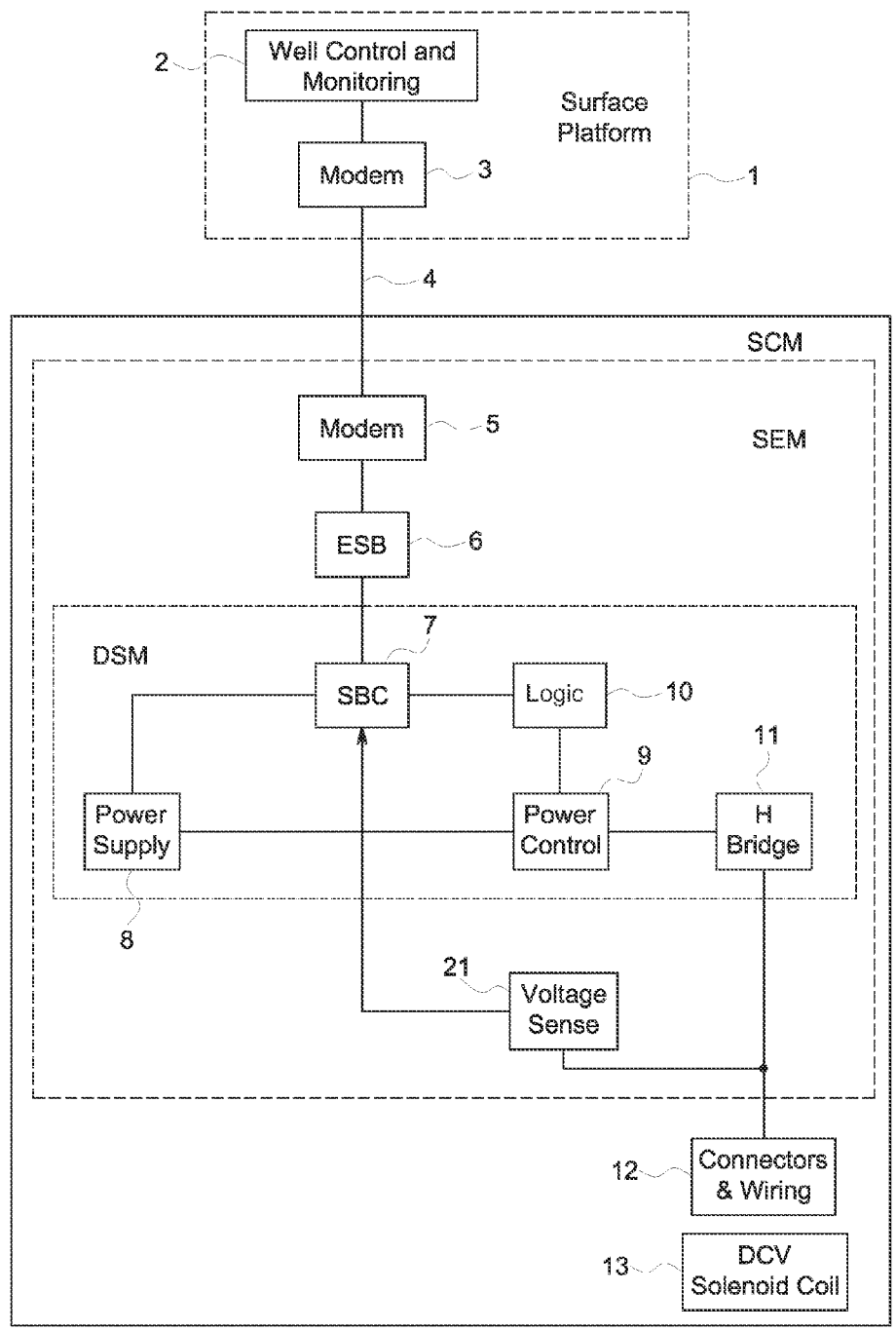
FIG. 4 is a schematic diagram of a control system for a subsea well operating in accordance with an embodiment of the invention.
Figure 5:
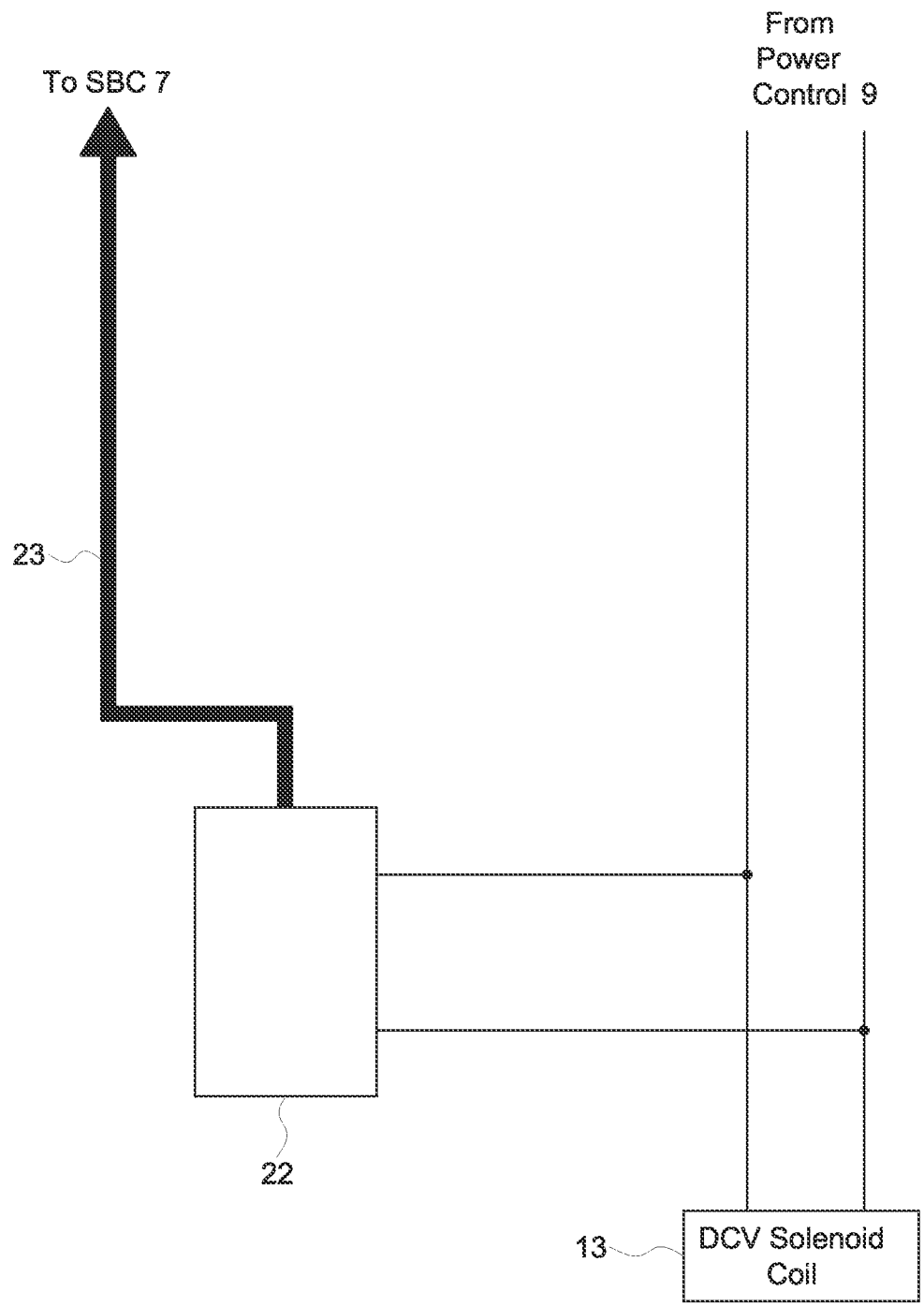
FIG. 5 shows details of voltage sensing means of the system of FIG. 4.

An alternative method of securing confidence that the control of DCVs via the well communication system is functioning correctly, without operating a valve, is to monitor the voltage pulse appearing across the coil 13, when the test pulse is applied. This is illustrated in FIGS. 4 and 5, there being voltage sensing means 21 in FIG. 4 between bridge 11 and connectors and wiring 12. The voltage sensing means 21 is detailed in FIG. 5, the voltage across the coil 13 being connected to an A/D converter 22. Items in FIG. 4 which correspond with items in FIG. 2 have the same reference numerals as in FIG. 2. The digital output 23 of the A/D converter 22 represents the test voltage across the coil 13 and is fed to the SBC 7 where it again can either be sent to the surface platform for verification, or compared in the SBC 7, with stored values of correct expected test values and a verification, or otherwise, message sent to the surface platform. This method of verification of the correct functioning of the DCV coil drive does have the disadvantage over the current flow method of not providing confidence in the continuity of the solenoid coil itself.

The revenue generated from an oil well can be millions of U.S. dollars per day, which would be lost if the production ceased because of a faulty valve circuit. The cost to fix this problem can be hundreds of thousands of U.S. dollars per day for the boat/submarine hire to recover and replace the faulty equipment from the seabed. Worse still, if the fault occurs outside an operational weather window, then the maintenance might not be possible for several months with the corresponding several months of lost production. Embodiments of the invention enable detection of faulty equipment involved with the well valve control system before it is needed, thus allowing any detected faulty component to be changed as part of scheduled maintenance.

What is claimed is:

1. A method of testing a control system including communications, control signal routing, wiring and a valve which is operable by a solenoid, the method comprising:
    sending a command message from a command module to a single board computer (SBC), the command message comprising a test tag instructing the SBC to apply a pulse of current through a coil of the solenoid, the pulse of current being insufficient to cause the solenoid to operate the valve, wherein the valve is a subsea directional control valve of a subsea fluid extraction well having a topside control location and the application of said pulse of current through the coil is caused from the topside control location of the fluid extraction well; and
    monitoring a response of the system to the pulse of current, wherein monitoring the response comprises comparing the response to a predetermined value to detect whether the control signal routing is functioning properly, wherein operation of the valve is normally controlled from the topside location via a communication route including the control signal route, and during testing, the step of applying a pulse of current through the coil takes place via the same communication route.

2. A method according to claim 1, wherein the response is monitored by monitoring current in the system.

3. A method according to claim 2, wherein the response is monitored by monitoring current through the coil.

4. A method according to claim 1, wherein the response is monitored by monitoring voltage across the coil.

5. A method according to claim 1, wherein a result of monitoring the response is compared with at least one expected result.

6. A method according to claim 5, wherein a result of the comparison is sent to the topside location.

7. A method according to claim 5, wherein an indication of the result of monitoring is sent to the topside location.

8. A control system including communications, control signal routing, wiring and a valve which is operable by a solenoid, the system comprising:
    a power control configured to send a command message from a command module to a single board computer (SBC), the command message comprising a test tag instructing the SBC to apply a pulse of current through a coil of the solenoid, the current being insufficient to cause the solenoid to operate the valve, wherein the valve is a subsea directional control valve of a subsea fluid extraction well having a topside control location and the application of said pulse of current through the coil is caused from the topside control location of the fluid extraction well; and
    a monitoring arrangement configured to monitor a response of the system to the pulse of current, wherein monitoring the response comprises comparing the response to a predetermined value to detect whether the control signal routing is functioning properly, wherein operation of the valve is normally controlled from the topside location via a communication route including the control signal routing, and during testing, the step of applying a pulse of current through the coil takes place via the same communication route.

9. The system according to claim 8, wherein the monitoring arrangement is adapted for monitoring current in the system.

10. The system according to claim 9, wherein the monitoring arrangement is adapted for monitoring current through the coil.

11. The system according to claim 8, wherein the monitoring arrangement is adapted for monitoring voltage across the coil.

12. The system according to claim 8, further comprising means for comparing a result of monitoring the response with at least one expected result.

13. The system according to claim 12, wherein said comparing means is located subsea.

14. The system according to claim 13, further comprising means for sending a result of the comparison to the topside location.

15. The system according to claim 8, further comprising means for sending an indication of the result of monitoring to the topside location.

16. The method according to claim 1, wherein monitoring the response of the system comprises sensing current at a position immediately before the coil using a Hall effect device.

17. A method according to claim 1, wherein the pulse of current applied through the coil of the solenoid is turned off before the valve starts operating.

18. The system according to claim 8, wherein the pulse of current applied through the coil of the solenoid is turned off before the valve starts operating.

19. A method according to claim 1, wherein the pulse of current applied through the coil of the solenoid is applied for a time duration in range of 10-20 milliseconds.

20. The system according to claim 8, wherein the pulse of current applied through the coil of the solenoid is applied for a time duration in range of 10-20 milliseconds.

* * * * *